US012648057B2

(12) United States Patent
Shin et al.

(10) Patent No.: US 12,648,057 B2
(45) Date of Patent: Jun. 2, 2026

(54) COOKER

(71) Applicant: LG ELECTRONICS INC., Seoul (KR)

(72) Inventors: Jaeyoung Shin, Seoul (KR); Sunghun Sim, Seoul (KR); Junghyeong Ha, Seoul (KR); Taeho Kim, Seoul (KR); Taehee Kim, Seoul (KR); Yongsoo Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 821 days.

(21) Appl. No.: 17/920,179

(22) PCT Filed: Sep. 1, 2020

(86) PCT No.: PCT/KR2020/011733
§ 371 (c)(1),
(2) Date: Oct. 20, 2022

(87) PCT Pub. No.: WO2021/215593
PCT Pub. Date: Oct. 28, 2021

(65) Prior Publication Data
US 2023/0180358 A1      Jun. 8, 2023

(30) Foreign Application Priority Data

Apr. 21, 2020      (KR) ........................ 10-2020-0048200

(51) Int. Cl.
*H05B 6/64*          (2006.01)
*H05B 6/10*          (2006.01)
(Continued)

(52) U.S. Cl.
CPC ........... *H05B 6/6488* (2013.01); *H05B 6/105* (2013.01); *H05B 6/129* (2013.01); *H05B 6/76* (2013.01); *H05K 9/0081* (2013.01)

(58) Field of Classification Search
CPC ...... H05B 6/105; H05B 6/129; H05B 6/6482; H05B 6/6488; H05B 6/76; H05B 3/76;
(Continued)

(56) References Cited

U.S. PATENT DOCUMENTS 6,147,336  A  *  11/2000  Ushijima ............. H05B 6/6485
                                                                        219/699
6,147,338  A       11/2000  Ushijima et al.
(Continued)

FOREIGN PATENT DOCUMENTS

EP          2 597 930 B1      7/2017
JP          3-196611 A       8/1991
(Continued)

OTHER PUBLICATIONS

International Search Report (PCT/ISA/210), issued in PCT/KR2020/011733, dated Dec. 30, 2020.

*Primary Examiner* — Quang T Van

(74) *Attorney, Agent, or Firm* — Birch, Stewart, Kolasch & Birch, LLP

(57) ABSTRACT

A cooker having a plurality of heat sources and a housing having a cavity formed therein; a door connected to the housing so as to open/close the cavity; a MW heating module for radiating microwaves to the cavity; an IH heating module for radiating a magnetic field toward the cavity; and a shielding member for enabling the magnetic field generated by the IH heating module to pass through, while blocking the microwaves radiated from the MW heating module. The shielding member has carbon fiber.

18 Claims, 7 Drawing Sheets

(51) Int. Cl.

| | | |
|---|---|---|
| *H05B 6/12* | (2006.01) | |
| *H05B 6/76* | (2006.01) | |
| *H05K 9/00* | (2006.01) | |

(58) Field of Classification Search

CPC .... H05B 6/6414; H05B 6/763; H05K 9/0081; H05K 9/009; Y02B 40/00; C01G 39/00; C01G 39/02; C01P 2006/80

USPC ....... 219/601, 620, 622, 624, 634, 653, 656, 219/670, 675, 676, 680, 738, 699, 700, 219/701, 628, 629, 630

See application file for complete search history.

(56) References Cited

U.S. PATENT DOCUMENTS

| | | | |
|---|---|---|---|
| 8,715,533 B2 | 5/2014 | Takagi et al. | |
| 2008/0058467 A1 | 3/2008 | Takagi et al. | |
| 2009/0008386 A1 | 1/2009 | Louie et al. | |
| 2023/0180358 A1* | 6/2023 | Shin ........................ | H05B 6/129 219/601 |

FOREIGN PATENT DOCUMENTS

| | | | |
|---|---|---|---|
| JP | 5627726 B2 | 11/2014 | |
| KR | 10-0597966 B1 | 7/2006 | |
| KR | 10-2008-0037796 A | 5/2008 | |
| KR | 10-2083908 B1 | 3/2020 | |

* cited by examiner

COOKER

CROSS-REFERENCE TO RELATED APPLICATIONS

This application is the National Phase of PCT International Application No. PCT/KR2020/011733, filed on Sep. 1, 2020, which claims priority under 35 U.S.C. 119(a) to Korean Patent Application No. 10-2020-0048200, filed in the Republic of Korea on Apr. 21, 2020, all of which are hereby expressly incorporated by reference into the present application in their entireties.

TECHNICAL FIELD

The present disclosure relates to a cooking appliance.

BACKGROUND ART

Various types of cooking appliances are used to heat food at home or in a restaurant. For example, various cooking appliances such as a microwave oven, an electric range of an induction heating method, and a grill heater are used.

The microwave oven is a high-frequency heating-type cooking appliance and uses excessive vibration and heating of molecules in a high-frequency electric field to evenly heat food in a short time.

The electric range of an induction heating method is a cooking appliance that uses electromagnetic induction to heat an object to be heated. Specifically, the electric range of an induction heating method generates an eddy current in an object to be heated made of a metal component by using a magnetic field generated around a coil when high-frequency power of a predetermined size is applied to the coil to heat the object to be heated itself.

The grill heater is a cooking appliance that heats food by radiation or convection of infrared heat, and since infrared heat penetrates food, the grill heater is capable of cooking evenly throughout.

As such, as cooking appliances using various types of heat sources are released, the number and types of cooking appliances provided by users have increased, and there is a problem that these cooking appliances occupy a large volume in a living space. Accordingly, users' demand for a complex cooking appliance having a plurality of heating modules together is increasing. In addition, there is a need to develop a cooking appliance that uses a plurality of heating methods at the same time to more uniformly and quickly cook food in the object to be heated.

Korean Patent Publication No. 10-2008-0037796 (published on May 2, 2008) discloses a cooking appliance that uses microwave and induction heating coil heat sources simultaneously. However, according to a conventional cooking appliance, there is an inconvenience by installing a separate conductor tray to solve the problem that microwaves heat the induction heating coil.

In addition, the conventional cooking appliance needs to include a separate sensor unit for determining whether a conductor tray is installed or not, and thus has a complicated structure, increases manufacturing costs, and has a limit in that it is not possible to use a microwave heat source when the conductor tray is not installed.

DISCLOSURE

Technical Problem

The present disclosure is to provide a complex cooking appliance having a plurality of heat sources.

The present disclosure is to provide a cooking appliance having a microwave (MW) heating module and an induction heating (IH) heating module together. More specifically, the present disclosure is to provide a cooking appliance in which a MW heating module and an IH heating module simultaneously heat an object to be heated.

The present disclosure is to provide a cooking appliance for maximizing efficiency of the IH heating module when the MW heating module and the IH heating module simultaneously heat an object to be heated.

Technical Solution

According to an embodiment of the present disclosure, a cooking appliance may include a microwave (MW) heating module configured to emit a microwave to a cavity and an induction heating (IH) heating module configured to emit a magnetic field toward the cavity, and in this case, the IH heating module includes a working coil and a shield member, and the shield member may include any one of carbon fiber, graphite, and graphene.

According to an embodiment of the present disclosure, a thickness of the shield member may be larger than a skin depth by an electromagnetic wave emitted from the MW heating module, and may be smaller than a skin depth by an electromagnetic wave emitted from the IH heating module, and thus microwaves may be blocked, and an induced magnetic field may pass.

Advantageous Effects

According to the present disclosure, since a shield member of a cooking appliance may pass an induction magnetic field generated by a working coil therethrough and may block microwaves at the same time, there may be an advantage of simultaneously driving a MW heating module and an IH heating module.

In addition, the shield member may be formed of any one of carbon fiber, graphite, and graphene, and thus heating by the IH heating module may be minimized, thereby minimizing a decrease in heating efficiency of the IH heating module.

In addition to the above-described effects, specific effects of the present disclosure will be described together while explaining the specific details below.

BEST MODE

Figure 1:
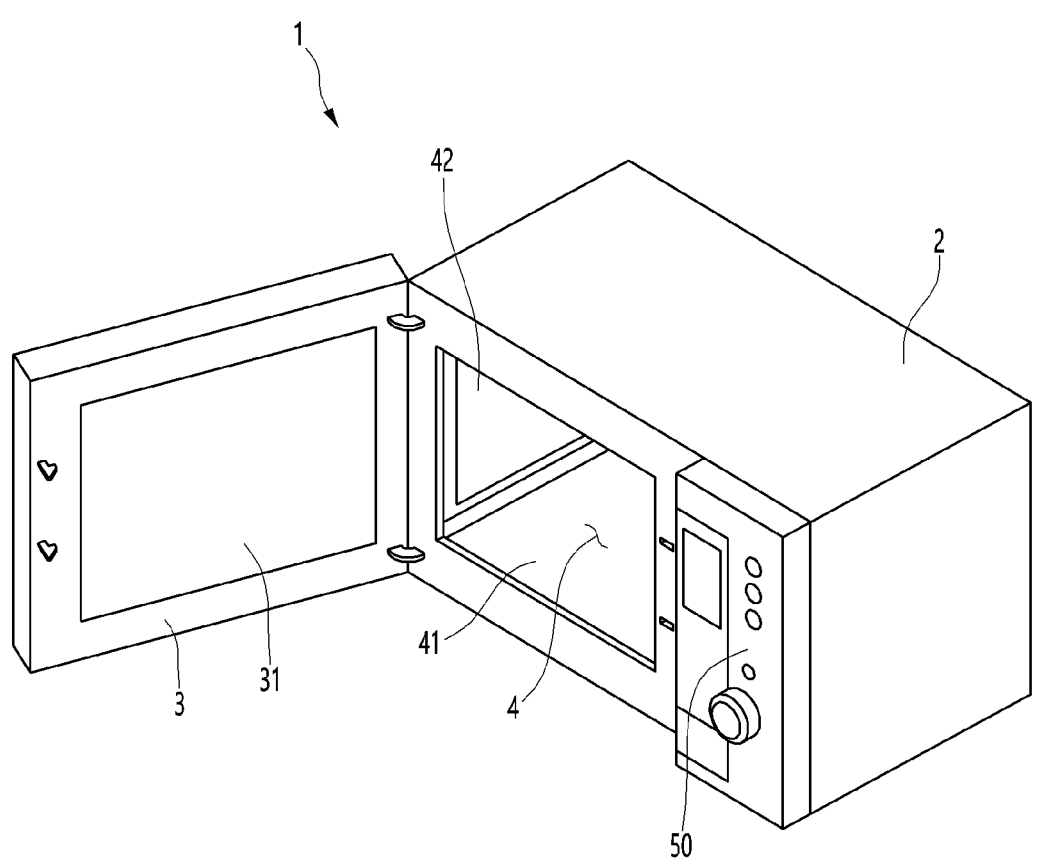
FIG. 1 is a perspective view of a cooking appliance according to an embodiment of the present disclosure.

Hereinafter, an embodiment according to the present disclosure will be described in detail with reference to the accompanying drawings. In the drawings, the same reference numerals are used to refer to the same or similar components.

Hereinafter, a cooking appliance according to an embodiment of the present disclosure will be described.

FIG. 1 is a perspective view of a cooking appliance according to an embodiment of the present disclosure.

A cooking appliance 1 according to an embodiment of the present disclosure may include a housing 2 and a door 3 connected to the housing 2.

A cavity 4 may be formed in the housing 2 and may be a cooking room. The cavity 4 may be a cooking space in which an object to be heated is put.

An input interface 50 may be formed on an external surface of the housing 2. The input interface 50 may receive input for manipulating the cooking appliance from a user.

The cavity 4 may be opened or closed by the door 3. The door 3 may be attached to a front part of the housing 2 to be opened or closed. The door 3 may open and close the cavity 4. A window 31 may be formed in the door 3. The user may check the inside of the cavity 4 through the window 31 in the state in which the cavity 4 is closed. The window 31 will be described in detail with reference to FIG. 3.

The cavity 4 may be formed by first to fifth surfaces, and may be opened or closed depending on the position of the door 3. The first surface of the cavity 4 may be a bottom surface 41, a second surface may be a ceiling surface 43 (refer to FIG. 5), a third surface may be a rear surface 45 (refer to FIG. 5), and fourth and fifth surfaces may be both side surfaces. The side surfaces may each be in contact with the bottom surface 41, the ceiling surface 43, and the rear surface 45. One surface 42 of the side surfaces may be formed close to the door 3, and the other (not shown) may be formed close to the input interface 50.

Figure 2:
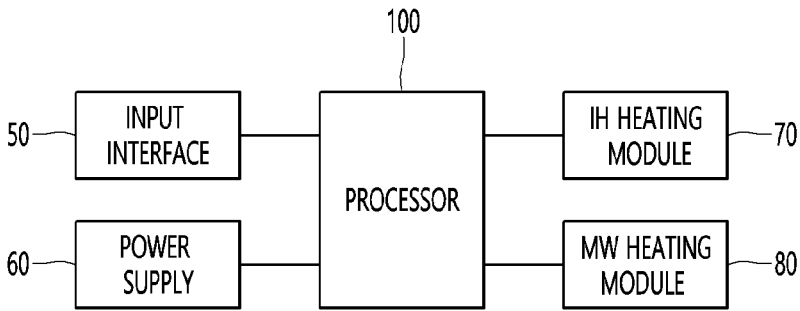
FIG. 2 is a control block diagram of a cooking appliance according to an embodiment of the present disclosure.
Figure 3:
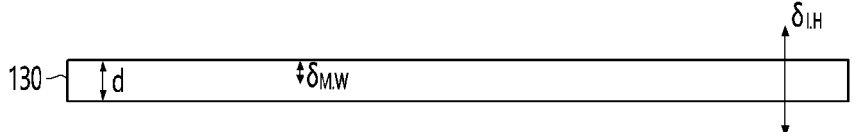
FIG. 3 is an exemplary view viewed from a side of a shield member provided in a cooking appliance of the present disclosure.
Figure 4:
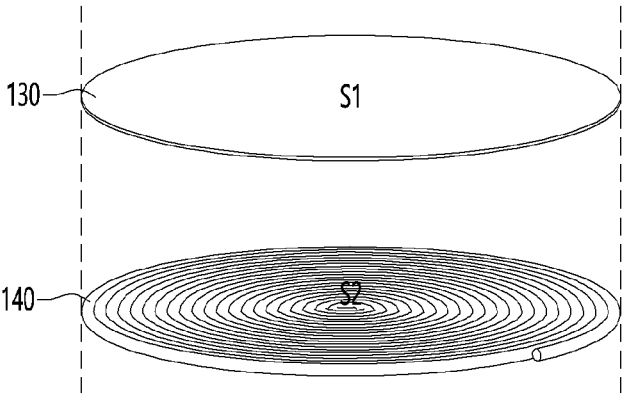
FIG. 4 is a perspective view of a shield member and a working coil that are included in a cooking appliance of the present disclosure.

FIG. 2 is a control block diagram of a cooking appliance according to an embodiment of the present disclosure. FIG. 3 is an exemplary view viewed from a side of a shield member provided in a cooking appliance of the present disclosure. FIG. 4 is a perspective view of a shield member and a working coil that are included in a cooking appliance of the present disclosure.

The cooking appliance 1 may include the input interface 50, a power supply 60, an induction heating (IH) heating module 70, a microwave (MW) heating module 80, and a processor 100. FIG. 2 is only an example for convenience of explanation, and the cooking appliance 1 according to an embodiment of the present disclosure may further include other components in addition to the components shown in FIG. 2, or some of the shown components may be omitted.

The processor 100 may control the overall operation of the cooking appliance 1. The processor 100 may control each of the input interface 50, the power supply 60, the IH heating module 70, and the MW heating module 80. The processor 100 may control the IH heating module 70 and the MW heating module 70 to operate the cooking appliance 1 according to the input received through the input interface 50.

The input interface 50 may receive various inputs for manipulating the cooking appliance 1. For example, the input interface 50 may receive an operation start input or an operation stop input of the cooking appliance 1. As another example, the input interface 50 may receive an input for driving the IH heating module 70 or an input for driving the MW heating module 80.

The power supply 60 may receive power required for an operation of the cooking appliance 1 from the outside. The power supply 60 may supply power to the input interface 50, the IH heating module 70, the MW heating module 80, the processor 100, and the like.

The IH heating module 70 may be an induction heating type heat source. The IH heating module 70 may emit a magnetic field toward the cavity 4.

The IH heating module 70 may generate a magnetic field through a working coil, and when the object to be heated in the cavity 4 is a magnetic material, the object to be heated may be directly heated.

In detail, the IH heating module 70 may include at least some or all of a working coil, a plate, an insulator, and ferrite. In addition, the IH heating module 70 may further include an inverter for driving the IH heating module 70.

The working coil 140 (refer to FIG. 4) may generate a magnetic field. The working coil 140 may directly heat a magnetic object to be heated (i.e., a magnetic material).

The working coil 140 may heat the object to be heated by an induction heating method, and may be provided to overlap a shield member 130 (refer to FIGS. 3 and 4) in a vertical direction (i.e., in a vertical direction or in upward and downward directions).

As shown in FIG. 3, the cooking appliance 1 may further include the shield member 130.

The shield member 130 may pass a magnetic field generated by the IH heating module 70, particularly, the working coil 140, and may not pass microwaves generated from the MW heating module 80.

The thickness of the shield member 130 may be larger than a skin depth by microwaves. Accordingly, the shield member 130 may block microwaves. In addition, the thickness of the shield member 130 may be smaller than a skin depth by electromagnetic waves generated by the working coil 140. Accordingly, the shield member 130 may pass an inductive magnetic field generated by the working coil 140 therethrough.

The shield member 130 may be disposed between the cavity 4 and the working coil 140. Not only the shield member 130 but also an insulator may be further disposed between the cavity 4 and the working coil 140.

The shield member 130 may be provided to overlap the working coil 140 in a vertical direction (i.e., in a vertical direction or in upward and downward directions), and thus MW heating and IH heating for the object to be heated may be possible at the same time.

According to an embodiment, the shield member 130 may be formed of a carbon material, or the like, but the shape and configuration of the shield member 130 will be described below.

The shield member 130 may be disposed below a plate 110 (refer to FIG. 5).

The plate 110 may cover the shield member 130. The plate 110 may protect the shield member 130 from the outside.

In detail, when the object to be heated is directly placed on the shield member 130, or food in the object to be heated overflows and flows to the shield member 130, the shield member 130 may be worn or contaminated. Therefore, the plate 110 may cover the shield member 130 to protect the shield member 130 from these problems.

The plate 110 may be formed of a non-magnetic component to pass a magnetic field therethrough. The plate 110 may be made of a glass material (e.g., ceramics glass).

The plate 110 may be formed of a component having heat resistance against heat of the object to be heated, heat of the shield member 130, and the like.

The plate 110 may dissipate heat of the shield member. When heat is generated in the shield member 130 by microwaves, the generated heat may be transferred to an insulator or the plate 110 to be described later, and the plate 110 may diffuse the heat.

The insulator may be disposed between the plate 110 and the shield member 130, and may be disposed between the shield member 130 and the working coil 140. The insulator may block heat generated while the shield member 130 or the object to be heated is heated by the driving of the MW heating module 80 from being transferred to the working coil.

That is, when the shield member 130 is heated by the MW heating module 80 or the object to be heated is heated by electromagnetic induction of the working coil 140, heat of the shield member 130 or the object to be heated may be transferred to the plate 110, and heat of the plate 110 may be transferred to the working coil 140 again to damage the working coil 140. By blocking heat transferred to the working coil 140, the insulator may prevent the working coil 140 from being damaged by heat and may further heating performance of the working coil 140 from being degraded.

The ferrite may be mounted below the working coil 140 and may block a magnetic field generated downward when the working coil 140 is driven.

The MW heating module 80 may provide microwaves to the cavity 4. The MW heating module 80 may emit microwaves into the cavity 4.

The MW heating module 80 may include a magnetron that is positioned outside the cavity 4 in the housing 2 to generate microwaves, and a waveguide that guides the microwaves generated from the magnetron to the cavity 4.

In FIG. 2, the cooking appliance 1 is shown as having only the IH heating module 70 and the MW heating module 80, but according to an embodiment, the cooking appliance 1 may further include a grill heater module (not shown).

The grill heater module (not shown) may supply radiant heat to heat food contained in the cavity 4. The grill heater module (not shown) may include a heating part (not shown) having an infrared heating wire, and may radiate or convection infrared heat generated from the heating part (not shown) into the cavity 4.

That is, according to an embodiment of the present disclosure, the cooking appliance 1 may include the IH heating module 70, the MW heating module 80, and the grill heater module (not shown), and the IH heating module 70 may emit a magnetic field toward the first surface of the cavity 4, the MW heating module 80 may supply microwave to the cavity 4 through the second surface of the cavity 4, and the grill heater module (not shown) may supply radiant heat to the cavity 4 through the third surface of the cavity 4.

Hereinafter, the case in which the cooking appliance 1 includes the IH heating module 70 and the MW heating module 80 will be described.

When the IH heating module 70 and the MW heating module 80 of the cooking appliance 1 operate simultaneously, the working coil 140 of the IH heating module 70 may be damaged by microwaves generated from the MW heating module 80. In addition, when the working coil 140 is heated by microwaves, there may be a problem that it is not possible to accurately control the IH heating module 70.

Therefore, the cooking appliance 1 of the present disclosure may include the shield member 130 to protect the IH heating module 70.

Hereinafter, the shape and configuration of the shield member 130 provided in the cooking appliance 1 of the present disclosure will be described in more detail.

In FIG. 3, 'd' refers to a thickness of the shield member 130, $\delta_{M.W}$ refers to a skin depth by electromagnetic waves emitted from the MW heating module 80, and $\delta_{I.H}$ refers to a skin depth by electromagnetic waves emitted from the IH heating module 70.

The shield member 130 may be made of a conductor.

When an alternating current flows through a conductor, a skin effect occurs in the conductor. The skin effect refers to a phenomenon in which the current flows concentrated on a surface of the conductor as a frequency of the current flowing through the conductor increases. In this case, a depth from the surface of the conductor to a region through which current flows may be defined as a skin depth ($\delta$).

The skin depth is reduced as the frequency of the current flowing through the conductor increases, and is increased as the frequency of the current decreases. When the skin depth by a specific electromagnetic wave is smaller than the thickness of the conductor, the electromagnetic wave is not capable of passing through the conductor. In contrast, when the skin depth by a specific electromagnetic wave is greater than the thickness of the conductor, that electromagnetic wave is capable of passing through the conductor.

In general, the frequency of the electromagnetic wave (microwave) emitted by the MW heating module 80 is in gigahertz (GHz, $10^5$ Hz), and the frequency of the electromagnetic wave emitted by the IH heating module 70 is in kilohertz (KHz, $10^3$ Hz). For example, the frequency of microwave may be 2.4 to 2.5 GHz, and the frequency of electromagnetic wave emitted from the IH heating module 70 may be 35 to 60 KHz, but this is only an example.

According to an embodiment of the present disclosure, a thickness (D) of the shield member may be larger than the skin depth ($\delta_{M.W}$) by microwaves, and may be smaller than the skin depth ($\delta_{I.H}$) by electromagnetic waves emitted from the IH heating module 70. The thickness (D) of the shield member 130 of the present disclosure may be larger than a value obtained by multiplying the skin depth ($\delta_{M.W}$) by microwaves by a predetermined constant (e.g., 4) in order to more effectively block microwaves, and may be smaller than the skin depth ($\delta_{I.H}$) by electromagnetic waves emitted from the IH heating module 70.

Accordingly, the shield member 130 of the present disclosure may shield microwaves generated from the MW heating module 80, and may pass an induced magnetic field emitted from the IH heating module 70 therethrough.

The shield member 130 of the present disclosure may be made of any one of carbon fiber, graphite, and graphene.

When the shield member 130 is made of any one of carbon fiber, graphite, and graphene, the shield member 130 may exhibit excellent microwave shielding performance due to high electrical conductivity. In addition, since heating by the IH heating module 70 is minimized in the shield member 130, heating performance of the IH heating module 70 may be maximized.

In addition, when the shield member 130 is made of any one of carbon fiber, graphite, and graphene, it may be easy to emit heat from microwaves due to high thermal conductivity.

In addition, when the shield member 130 is composed of carbon fiber, the shield member 130 may be made of any one of a single carbon fiber material and a composite carbon fiber material.

The single carbon fiber material may have any one of a fabric form, a felt form, a mat form, and a paper form depending on a manufacturing method.

The composite carbon fiber material may refer to a material that further contains metal, ceramic, and carbon particles in the carbon fiber.

When the shield member 130 is made of a single carbon fiber material and is in a fabric form, the shield member 130 may be lighter than other types of single materials and may have an advantage of being easily transported and processed during a manufacturing process.

When the shield member 130 is made of a single carbon fiber material and is in a felt form, the shield member 130 may have an advantage of being easily fixed inside the cooking appliance due to high shape fixability thereof compared with other types of single material.

When the shield member 130 is made of a single carbon fiber material and is in a paper form, the shield member 130 may have an advantage of being easily processed compared with other types of single material.

In addition, the shield member 130 of the present disclosure may not be patterned. Accordingly, there is an advantage in that a manufacturing process is simplified because a separate processing process for generating a pattern is not necessary.

Then, referring to FIG. 4, the shield member 130 may be disposed to overlap the working coil 140 in a vertical direction. The size of the shield member 130 may be larger or smaller than the size of the working coil 140.

In this specification, although the shapes of the shield member 130 and the working coil 140 are shown in a circular shape, each of the shield member 130 and the working coil 140 may have various shapes, and the scope of the present disclosure is not limited.

A horizontal cross-sectional area S1 of the shield member 130 may be equal to a horizontal cross-sectional area S2 of the working coil 140 or may be larger than the horizontal cross-sectional area S2 of the working coil 140.

When the horizontal cross-sectional area S1 of the shield member 130 is equal to the horizontal cross-sectional area S2 of the working coil 140 or is larger than the horizontal cross-sectional area S2 of the working coil 140, there may be an advantage of effectively shielding the working coil 140 from microwaves.

That is, if the horizontal cross-sectional area S1 of the shield member 130 is equal to or larger than the horizontal cross-sectional area S2 of the working coil 140, a shielding effect may be obtained, and accordingly the shielding effect may be achieved even if the shield member 130 is not placed on an entire upper or lower surface of the plate 110.

Figure 5:
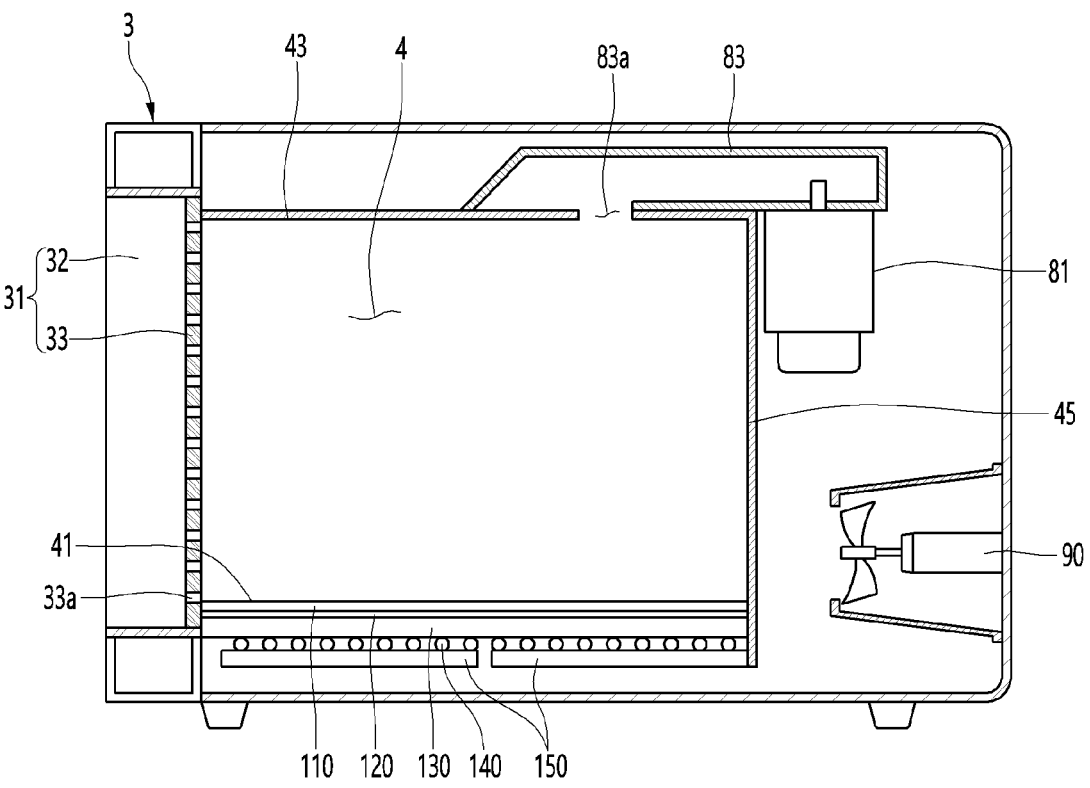
FIG. 5 is a cross-sectional view of a cooking appliance according to a first embodiment of the present disclosure.

FIG. 5 is a cross-sectional view of a cooking appliance according to a first embodiment of the present disclosure.

The door 3 may open and close the cavity 4. The window 31 may be formed in the door 3, and may include a window unit 32 and a shielding unit 33.

The window unit 32 may be formed of a transparent material or a translucent material. A user may see the inside of the cavity 4 through the window unit 32. An external surface of the window unit 32 may face the outside of the cooking appliance 1, and an inner surface of the window unit 32 may face the inside of the cooking appliance 1.

The shielding unit 33 may be mounted on the inner surface of the window unit 32. The shielding unit 33 may block microwaves of the cavity 4 from moving to the outside of the cooking appliance 1 through the door 3.

The shielding unit 33 may be an iron net. A plurality of shielding holes 33a may be formed in the shielding unit 33, and the shielding holes 33a may have a size larger than a wavelength of visible light and smaller than a wavelength of a microwave. Accordingly, the user may see the inside of the cavity 4 through the shielding holes 33a, and the microwave may not pass through the shielding holes 33a.

The housing 2 may include the plate 110 defining the first surface (e.g., the bottom surface 41) of the cavity 4.

The IH heating module 70 may include the plate 110 defining the first surface of the cavity 4, the insulator 120 disposed below the plate 110, and the working coil 140 for generating a magnetic field. The IH heating module 70 may emit a magnetic field towards the first surface of the cavity 4.

According to the first embodiment, the shield member 130 may be disposed on the entire upper surface of the plate 110 or the entire lower surface of the plate 110. The shield member 130 may be disposed between the insulator 120 and the working coil 140. In FIG. 5, it is assumed that the shield member 130 is disposed entirely between the insulator 120 and the working coil 140, but this is merely an example for convenience of description, and thus is not limited thereto.

In this case, the plate 110 may be formed of a non-magnetic component to pass a magnetic field therethrough. The plate 110 may be made of a glass material (e.g., ceramics glass). That is, according to the first embodiment, the plate 110 may cover the shield member 130 while defining the first surface 41 of the cavity 4.

A horizontal cross-sectional area of the shield member 130 may be equal to a horizontal cross-sectional area of the plate 110. Accordingly, movement of microwaves in the first surface of the cavity 4 may be blocked by the shield member 130.

Ferrite 150 may be disposed below the working coil 140. The ferrite 150 may be mounted below the working coil 140, and thus it may be possible to block a magnetic field generated downward when the working coil 140 is driven.

The working coil 140 may generate a magnetic field when driven, and when an object made of a magnetic material to be heated is placed in the cavity 4, the magnetic field may pass through the shield member 130 and may induce an eddy current in the object to be heated to heat the object to be heated.

To summarize, the IH heating module 70 of the cooking appliance 1 according to an embodiment of the present disclosure may heat a magnetic body, and may heat the corresponding object to be heated irrespective of the arrangement position of the object to be heated. Accordingly, the user may place the object to be heated on an arbitrary heating area on the cavity 4, and thus ease of use may be improved.

In the cooking appliance 1 according to an embodiment of the present disclosure, the object to be heated, placed in the cavity 4, may be heated by not only the IH heating module 70 but also the MW heating module 80.

The MW heating module 80 may be installed close to any one of the second to fifth surfaces of the cavity 4. For example, the MW heating module 80 may supply microwaves to the cavity 4 through the second surface of the cavity 4, and in this case, the second surface may be the ceiling surface 43, but this is only exemplary. That is, the second surface may be at least one of the remaining surfaces except for the surface from which the magnetic field is emitted by the IH heating module 70. Hereinafter, it is assumed that the second surface is the ceiling surface 43.

The MW heating module 80 may include a magnetron 81, a waveguide 83, and a cooling fan 90, and the waveguide 83 may have one side connected to the magnetron 81, and the other side connected to the cavity 4. At least one slot 83*a* through which microwaves pass may be formed in the ceiling surface 43 of the cavity 4. The cooling fan 90 may be installed around the magnetron 81 to cool the magnetron 81.

The object to be heated and food placed in the cavity 4 may be heated by the IH heating module 70 and the MW heating module 80.

In particular, according to the present disclosure, regardless of the position of the object to be heated, the food may be heated simultaneously by the IH heating module 70 and the MW heating module 80, which has an advantage of shortening a heating time.

Figure 6:
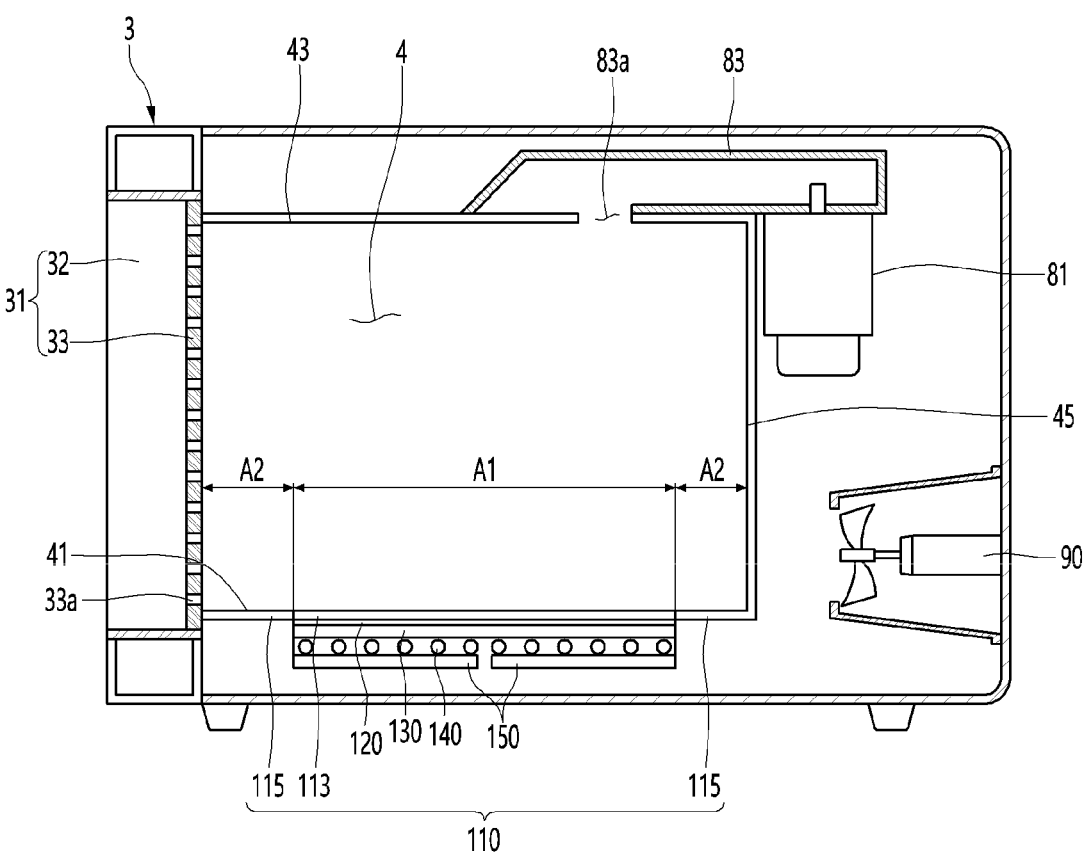
FIG. 6 is a cross-sectional view of a cooking appliance according to a second embodiment of the present disclosure.

Hereinafter, FIG. 6 is a cross-sectional view of a cooking appliance according to a second embodiment of the present disclosure.

Features of the door 3, the shield member 130, the MW heating module 80, etc. except for the structure and shape of the first surface 41 of the cavity 4 and the IH heating module 70 are the same as those described in the first embodiment, and thus a repeated descriptions will be omitted. That is, a method of heating the object to be heated by a magnetic field generated in the working coil 140 is the same as described in the first embodiment, and thus a repeated description will be omitted.

Referring to FIG. 6, the housing 2 may define the first surface (e.g., the bottom surface 41) of the cavity 4, and may include the plate 110 that at least partially overlaps the shield member 130 in a vertical direction.

The plate 110 may include a first plate 113 made of glass and a second plate 115 made of iron, which vertically overlap the shield member 130. The IH heating module 70 may emit a magnetic field towards the first surface 41 of the cavity 4.

The first plate 113 may be disposed inside the second plate 115. The area A1 in which the first plate 113 is formed may be a heating area, and an area A2 in which the second plate 115 is formed may be a non-heating area.

The horizontal cross-sectional area of the shield member 130 may be smaller than or equal to the horizontal cross-sectional area of the first plate 113.

The horizontal cross-sectional area of the shield member 130 may be equal to or larger than the horizontal cross-sectional area of the working coil 140.

The first plate 113 may be formed of a non-magnetic component to pass a magnetic field therethrough. The first plate 113 may be made of a glass material (e.g., ceramics glass). The first plate 113 may be formed of a component having heat resistance against heat of the object to be heated, heat of the shield member 130, and the like. The first plate 113 may dissipate heat of the shield member 130.

The second plate 115 may be made of a magnetic component. The second plate 115 may be formed of an iron material. The second plate 115 including a magnetic component may block microwaves from reaching the working coil 140.

According to the second embodiment, in the cooking appliance 1 of the present disclosure, the shield member 130 may be disposed only under the first plate 113 formed of a non-magnetic material rather than being entirely disposed on the first surface (e.g., the bottom surface 41) of the cavity 4, thereby minimizing a problem of damage to the IH heating module 70 due to microwaves.

Hereinafter, with reference to FIGS. 7 and 8, the configuration of a cooking appliance according to a third embodiment of the present disclosure will be described.

Figure 7:
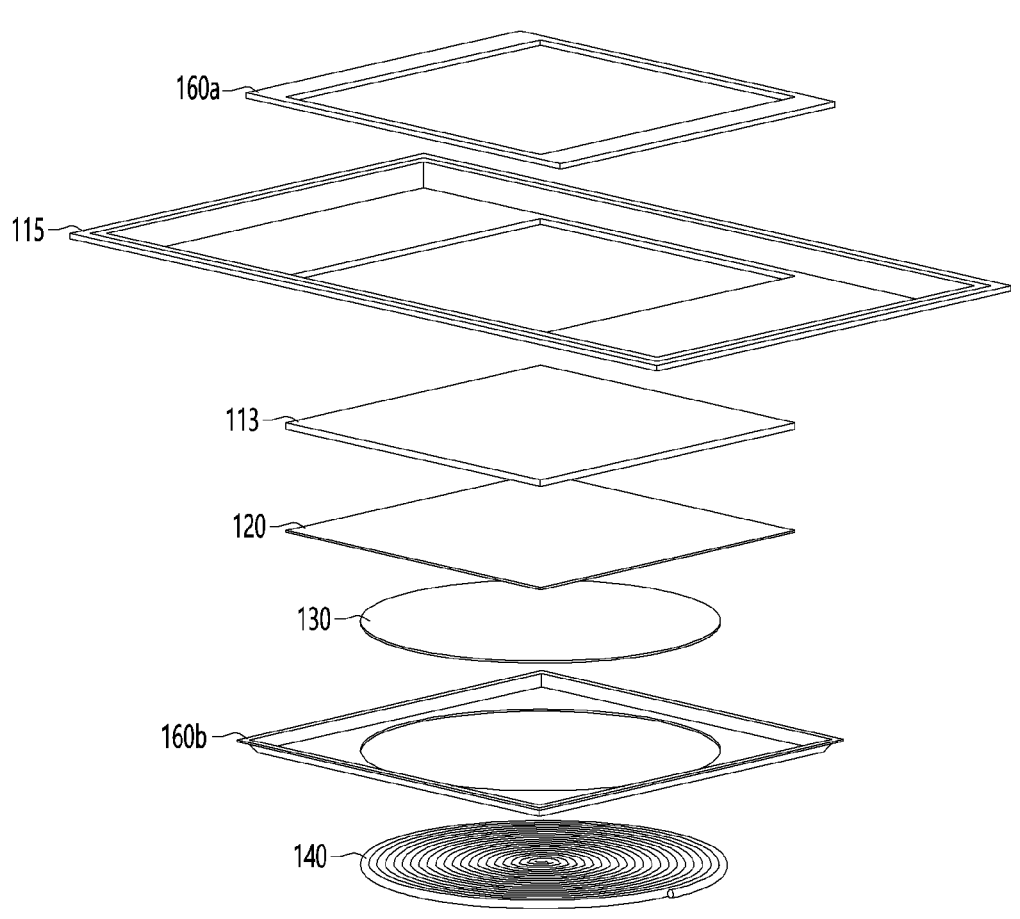
FIG. 7 is an exploded perspective view showing the configuration of an IH heating module according to a third embodiment of the present disclosure.
Figure 8:
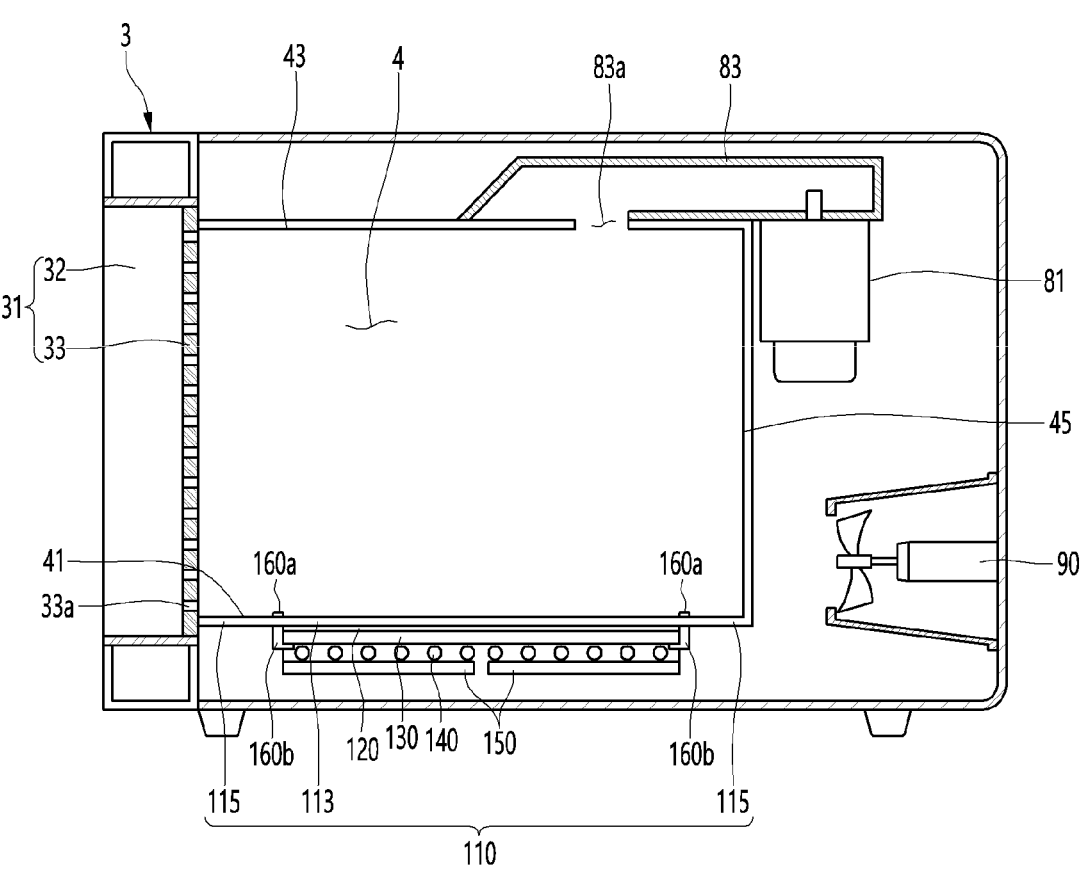
FIG. 8 is a cross-sectional view of a cooking appliance according to a third embodiment of the present disclosure.

FIG. 7 is an exploded perspective view showing the configuration of an IH heating module according to a third embodiment of the present disclosure. FIG. 8 is a cross-sectional view of a cooking appliance according to a third embodiment of the present disclosure.

According to the third embodiment, the IH heating module 70 of the present disclosure may further include connection members 160*a* and 160*b* for fixing the shield member 130 or the like.

The IH heating module 70 may include the working coil 140, the insulator 120, the first plate 113 made of glass, and the second plate 115 made of iron. According to the third embodiment, as shown in FIG. 7, the IH heating module 70 of the present disclosure may further include the connection members 160*a* and 160*b* for fixing the shield member 130 in the IH heating module 70. The connection members 160*a* and 160*b* may be holders or brackets, but these are examples only.

The insulator 120 may be disposed below the first plate 113, and the shield member 130 may be disposed below the insulator 120. Unlike the drawing, the shield member 130 may be disposed below the first plate 113, and the insulator 120 may be disposed below the shield member 130.

The first connection member 160*a* may be disposed above the first plate 113 and the second plate 115, the second connection member 160*b* may be disposed below the first plate 113 and the second plate 115, and the first plate 113, the second plate 115, the insulator 120, and the shield member 130 may be disposed between the first connection member 160*a* and the second connection member 160*b*.

Thus, the first connection member 160*a* and the second connection member 160*b* may fix the first plate 113, the second plate 115, the insulator 120, and the shield member 130. In addition, the first connection member 160*a* and the second connection member 160*b* may partition the heating region and the non-heating region.

Referring to the cross-sectional view of FIG. 8, the first connection member 160*a* may be disposed above the plate 110, and the second connection member 160*b* may be disposed below the plate 110 to surround the insulator 120 and the shield member 130. Accordingly, when the shield member 130 is disposed on an upper or lower surface of the plate 110, a fixing effect may be obtained by fixing only an end of the shield member 130 without requiring a separate bonding process or coating process, thereby simplifying a manufacturing process. The heating area by the IH heating module 70 may be clearly indicated to the user by partitioning the heating area and the non-heating area due to protrusion of the first connection member 160*a* into the cavity 4.

The above description is merely illustrative of the technical idea of the present disclosure, and various modifications and variations are possible without departing from the essential characteristics of the present disclosure by those of ordinary skill in the art to which the present disclosure pertains.

Accordingly, the embodiments disclosed in the present disclosure are not intended to limit the technical spirit of the present disclosure, but to explain, and the scope of the technical spirit of the present disclosure is not limited by these embodiments.

The scope of the present disclosure should be construed by the following claims, and all technical ideas within the scope equivalent thereto should be construed as being included in the scope of the present disclosure.

The invention claimed is:

1. A cooking appliance comprising:
a housing including a cavity;
a door connected to the housing;
a microwave heating part configured to emit a microwave to the cavity;
an induction heating part configured to emit a magnetic field toward the cavity; and
a shield member configured to pass the magnetic field generated by the induction heating part and to block the microwave emitted from the microwave heating part,
wherein the housing includes a plate that defines a first surface of the cavity, and
wherein the plate at least partially overlaps the induction heating part in a vertical direction and is configured to include a first plate including a glass material and a second plate including iron material.

2. The cooking appliance of claim 1, wherein a thickness of the shield member is greater than a first skin depth of a first electromagnetic wave emitted from the microwave heating part, and
wherein the thickness of the shield member is less than a second skin depth of a second electromagnetic wave emitted from the induction heating part.

3. The cooking appliance of claim 2, wherein the thickness of the shield member is greater than a multiple of the first skin depth.

4. The cooking appliance of claim 1, wherein the induction heating part includes:
a plate defining a first surface of the cavity;
an insulator disposed below the plate; and
a working coil configured to generate the magnetic field,
wherein the shield member is disposed between the insulator and the working coil.

5. The cooking appliance of claim 4, wherein a horizontal cross-sectional area of the shield member is greater than or equal to a horizontal cross-sectional area of the working coil.

6. The cooking appliance of claim 4, further comprising a magnetic shielding member disposed below the working coil and configured to block the magnetic field.

7. The cooking appliance of claim 1, wherein the shield member includes at least one of a single carbon fiber material and a composite carbon fiber material.

8. The cooking appliance of claim 7, wherein the single carbon fiber material has at least one of a fabric form, a felt form, a mat form, and a paper form.

9. The cooking appliance of claim 1, wherein the shield member includes at least one of graphite and graphene.

10. The cooking appliance of claim 1, wherein the shield member at least partially overlaps the induction heating part in a vertical direction.

11. The cooking appliance of claim 1, wherein the first plate is disposed inside the second plate.

12. The cooking appliance of claim 1, wherein the induction heating part at least partially overlaps the first plate in a vertical direction.

13. The cooking appliance of claim 12, wherein the first surface of the cavity is a bottom surface of the cavity.

14. The cooking appliance of claim 1, wherein the induction heating part is configured to emit the magnetic field toward a first surface of the cavity, and
wherein the microwave heating part is configured to emit the microwave to the cavity through a second surface of the cavity.

15. The cooking appliance of claim 1, wherein the first surface of the cavity is arranged opposite to the second surface of the cavity.

16. A cooking appliance comprising:
a housing including a cavity;
a microwave heating part configured to emit a microwave to the cavity for vibrating a water molecule;
an induction heating part configured to emit a magnetic field toward the cavity for inducing an eddy current; and
a shield member disposed between the induction heating part and the cavity,
wherein the housing includes a plate that defines a first surface of the cavity, and
wherein the plate at least partially overlaps the induction heating part in a vertical direction and is configured to include a first plate including a glass material and a second plate including iron material.

17. The cooking appliance of claim 16, wherein the shield member is configured to pass the magnetic field generated by the induction heating part and to block the microwave emitted from the microwave heating part, and
wherein the microwave heating part and the induction heating part are configured to operate at a same time.

18. The cooking appliance of claim 16, wherein the shield member includes at least one of carbon fiber, graphite, and graphene.

* * * * *